(12) United States Patent
Seo

(10) Patent No.: US 8,054,634 B2
(45) Date of Patent: Nov. 8, 2011

(54) CAMERA MODULE PACKAGE

(75) Inventor: Tae Jun Seo, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 743 days.

(21) Appl. No.: 12/216,418

(22) Filed: Jul. 3, 2008

(65) Prior Publication Data

US 2009/0009975 A1    Jan. 8, 2009

(30) Foreign Application Priority Data

Jul. 6, 2007    (KR) ........................ 10-2007-0067890

(51) Int. Cl.
*H05K 7/00*    (2006.01)

(52) U.S. Cl. ......................... 361/728; 361/715; 361/776

(58) Field of Classification Search .................. 361/772, 361/774, 776, 778, 715, 760, 720, 748; 257/776–778; 174/52.4, 52.3; 438/123–124, 438/113, 116, 106, 110, 111
See application file for complete search history.

(56) References Cited

U.S. PATENT DOCUMENTS

| | | | | |
|---|---|---|---|---|
| 3,777,154 A * | 12/1973 | Lindsey | .................. | 250/227.11 |
| 6,571,466 B1 | 6/2003 | Glenn et al. | | |
| 6,707,125 B2 * | 3/2004 | Harazono | ..................... | 257/434 |
| 7,012,315 B1 * | 3/2006 | Campbell | ..................... | 257/433 |
| 7,121,864 B1 * | 10/2006 | Yang | .............................. | 439/331 |
| 7,250,663 B2 * | 7/2007 | Campbell | ..................... | 257/433 |
| 7,791,184 B2 * | 9/2010 | Wood et al. | ..................... | 257/680 |
| 2006/0189216 A1 * | 8/2006 | Yang | .............................. | 439/680 |
| 2007/0040932 A1 * | 2/2007 | Chen | ............................. | 348/374 |
| 2011/0096224 A1 * | 4/2011 | Lee | ............................... | 348/374 |

FOREIGN PATENT DOCUMENTS

| | | |
|---|---|---|
| JP | 2001-188155 | 7/2001 |
| JP | 2005-339830 | 12/2005 |
| JP | 2006-294720 | 10/2006 |

OTHER PUBLICATIONS

Chinese Office Action issued Aug. 14, 2009 in corresponding Chinese Patent Application 200810131989.4.

* cited by examiner

*Primary Examiner* — Hung S Bui
(74) *Attorney, Agent, or Firm* — Staas & Halsey LLP

(57) ABSTRACT

There is provided a camera module package including: a housing having an optical system; a board bonded to a bottom end of the housing and mounting an image sensor on a top surface thereof; a contact part integrally formed in the housing to electrically connect a sensor bonding pad of the image sensor with a board bonding pad of the board each other when the housing is engaged with the board. In the camera module package, a process of bonding the housing and the board together is performed at the same time as a process of electrically connecting the image sensor and the board to each other. This simplifies an assembly process and enhances productivity. Also, the camera module package is fundamentally free from contamination of external contact terminals caused by an overflowing bonding material when the board and the housing are bonded together.

8 Claims, 5 Drawing Sheets

CAMERA MODULE PACKAGE

CROSS-REFERENCE TO RELATED APPLICATIONS

This application claims the priority of Korean Patent Application No. 2007-0067890 filed on Jul. 6, 2007, in the Korean Intellectual Property Office, the disclosure of which is incorporated herein by reference.

BACKGROUND OF THE INVENTION

1. Field of the Invention

The present invention relates to a camera module package, and more particularly, to a camera module package in which a process of bonding a housing and a board together is performed at the same time as a process of electrically connecting an image sensor and the board to simplify an assembly process and enhance productivity, and which is fundamentally free from contamination of an external contact terminal caused by an overflowing bonding material when the board and the housing are bonded together.

2. Description of the Related Art

In general, of late, a mobile telecommunication terminal such as a mobile phone, personal digital assistant (PDA), and a portable personal computer (PC) has commonly performed transmission of not only text or voice data but also image data.

To enable image data transmission or image chatting in line with such a trend, recently a camera module package has been basically installed in the mobile telecommunication terminal.

FIG. 1 illustrates a conventional camera module package, in which A is a chip on board (COB) type and B is a chip on film (COF) type. As shown in FIG. 1A, the COB type camera module package includes a lens barrel having a lens 11 disposed in an inner space thereof, and a housing 120 having a female screw formed on an inner circumferential surface thereof to be threaded with a male screw formed on an outer surface of the lens barrel 10 so as to be engaged with the lens barrel 10.

A retainer 13 having a lens hole 13a of a predetermined size formed therein is assembled to the lens barrel 10 to fix the lens 11 in position. Also, an infra-red (IR) filter 25 is disposed in the housing 20.

A board 40 having an image sensor 30 wire-bonded thereon by a plurality of wires is assembled to a bottom of the housing 20.

However, in this conventional camera module package 1a, the image sensor 30 and the board 40 are connected together by wire bonding, thus requiring a sufficient space above the image sensor 30. This accordingly increases size of the package, thus hampering miniaturization. Also, this necessitates packaging on an individual basis to thereby undermine productivity and raise manufacturing costs.

Moreover, the housing 20 and the board 40 are bonded together by a bonding material such as epoxy. Here, the bonding material flowing over an outer edge of the board 40 contaminates an external contact terminal 43 formed on the outer edge of the board 40. This accordingly causes contact points between the external contact terminal and the socket to be in poor contact with each other, thereby increasing a defect ratio and degrading reliability.

Also, as shown in FIG. 1B, in the COF type camera module package 1b, a lens barrel 10' having a lens embedded therein is screw-fastened to an inner surface of a housing 20'. A flexible board 40' having an image sensor 30' flip chip bonded thereon by bumps 35' is assembled to a bottom of the housing 20' having an IR filter 25' disposed therein. An epoxy 45' is filled in an outer edge of the image sensor 30'.

However, in this conventional camera module package 1b, the plurality of bumps 35' should be provided to flip-chip bond the image sensor onto the board 40. This causes particle defects during a process or impairs an imaging area of the image sensor 30'.

Moreover, a conductive film, i.e., anisotropic conductive film (ACF) (not shown) is adhered on the board 40' having an opening corresponding to the imaging area of the image sensor 30'. Then, the bumps 35' are formed on a top of the image sensor 30' to be in corresponding contact with pads (not shown) of the board. Thermal compression, when performed subsequently, may entail infiltration of foreign materials and contact defects. Besides, a considerable time is required to cure the conductive film, thus degrading productivity.

Also, when the bottom of the housing is bonded to the board by a bonding material, the bonding material overflows outward. This causes the external connecting terminal 43 formed on the outer edge of the board to be contaminated by the overflowing bonding material and in poor contact with other members. This has mainly led to deterioration of product reliability.

SUMMARY OF THE INVENTION

An aspect of the present invention provides a camera module package in which a process of bonding a housing and a board together is performed at the same times as a process of electrically connecting an image sensor and the board to each other, thus enhancing productivity, and which is fundamentally free from contamination of an external contact terminal caused by an overflowing bonding material when the board and the housing are bonded together.

According to an aspect of the present invention, there is provided a camera module package including: a housing having an optical system; a board bonded to a bottom end of the housing and mounting an image sensor on a top surface thereof; a contact part integrally formed in the housing to electrically connect a sensor bonding pad of the image sensor with a board bonding pad of the board each other when the housing is engaged with the board.

The contact part may include: a horizontal conductive line formed by plating on a horizontal groove formed in an inner surface of the housing and bonded by a bump to the sensor bonding pad formed on an top surface of the image sensor; and a vertical conductive line formed by plating on a vertical groove extended directly below from one end of the horizontal groove and bonded by a bump to the board bonding pad formed on the top surface of the board.

The contact part may include a plurality of external contact terminals extended from the vertical conductive line to be exposed to an outer surface of the housing.

The external contact terminals may be in flexible contact with contact pins of a socket mounted on a main board.

The external contact terminals may be formed in a terminal groove recessed with a predetermined depth in an outer surface of a lower end of the housing to expose the vertical conductive line outward.

The camera module package may further include a conductive adhesive between the horizontal conductive line and the sensor bonding pad.

The camera module package may further include a conductive adhesive between the vertical conductive line and the board bonding pad.

The optical system may include: a lens barrel assembled in a center hole formed in the housing to be movable in an optical axis direction and having a lens hole formed in a top surface thereof; and at least one lens disposed in the lens barrel.

A filtering part may be disposed between the lens and the image sensor.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1A:
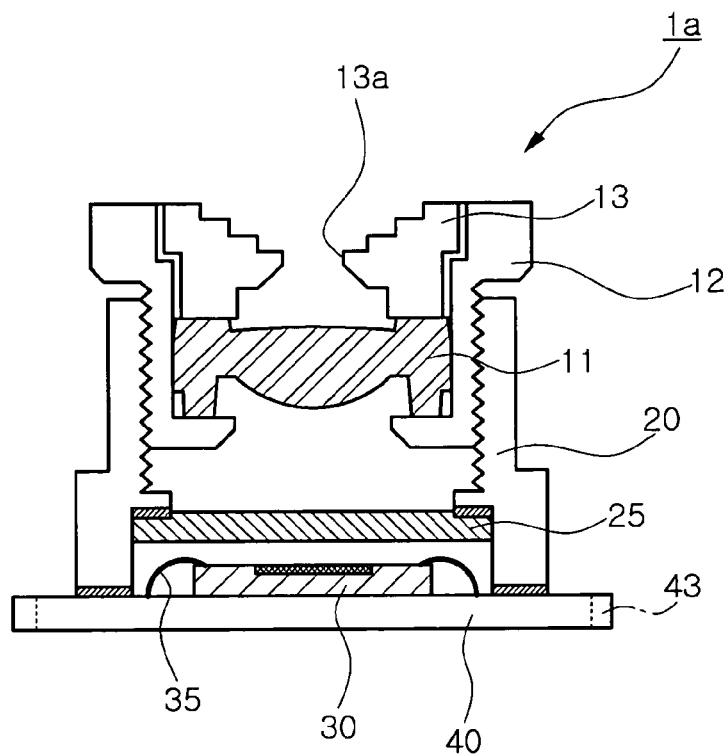
FIGS. 1A and 1B illustrate a conventional camera module package, in which A is a chip on board (COB) type package and B is a chip on film (COF) type package.
Figure 1B:
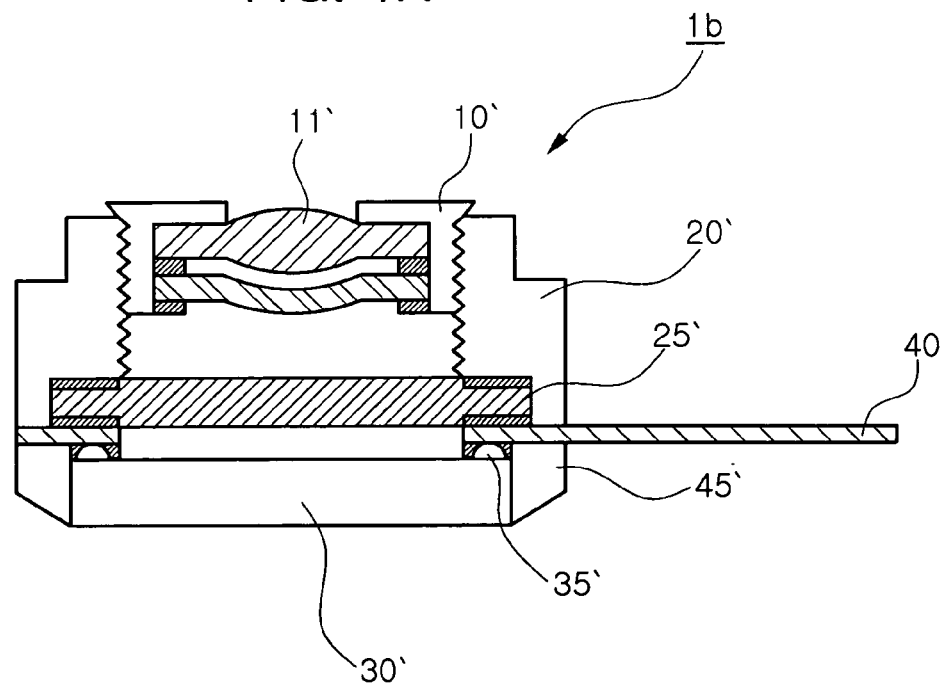
Figure 2:
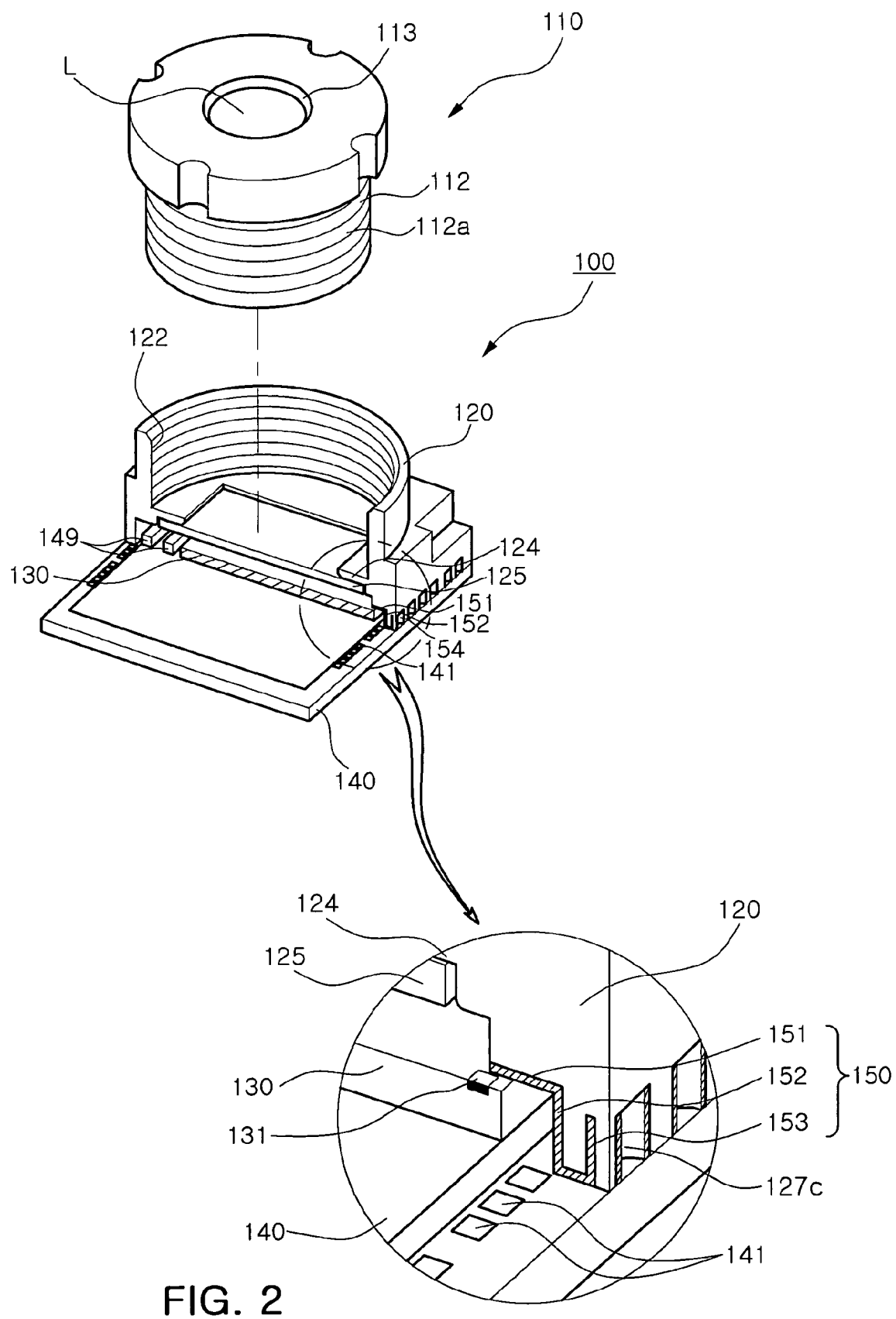
FIG. 2 is a configuration view illustrating a camera module package according to an exemplary embodiment of the invention.

FIG. 2 is a configuration view illustrating a camera module package according to an exemplary embodiment of the invention.

Figure 3:
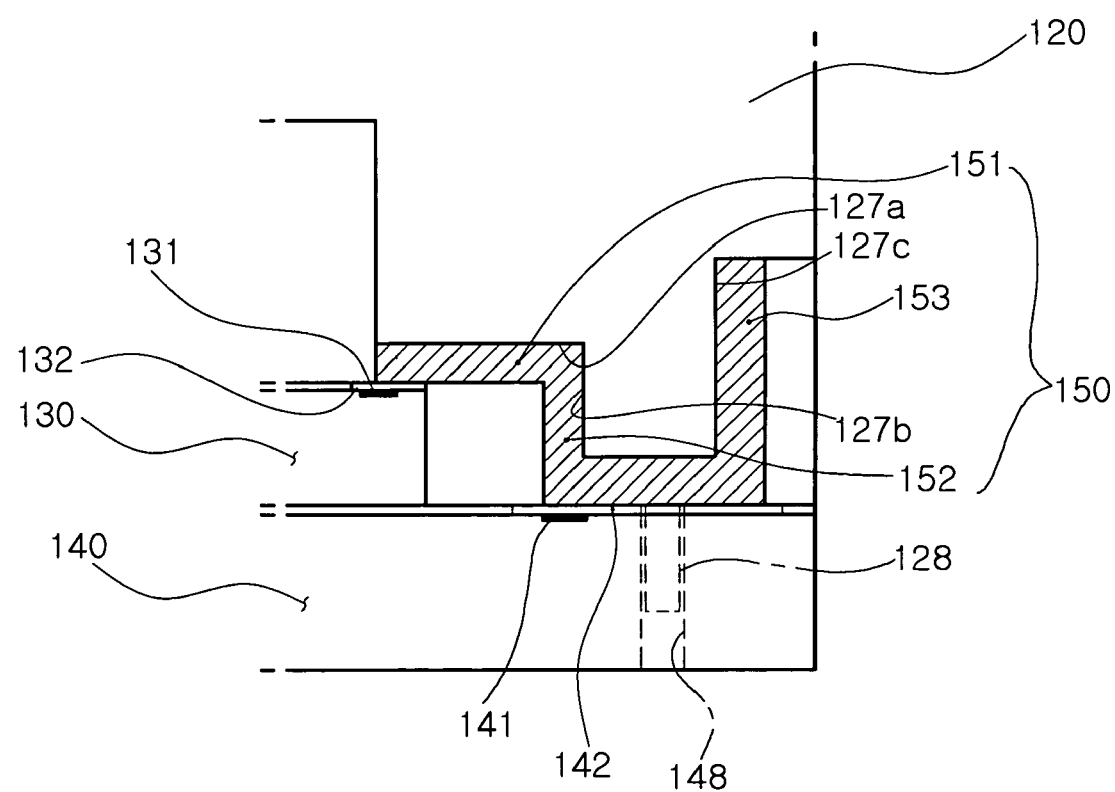
FIG. 3 is a longitudinal cross-sectional view illustrating a contact part employed in a camera module package according to an exemplary embodiment of the invention.

FIG. 3 is a longitudinal cross-sectional view illustrating a contact part employed in a camera module package according to an exemplary embodiment of the invention.

Figure 4:
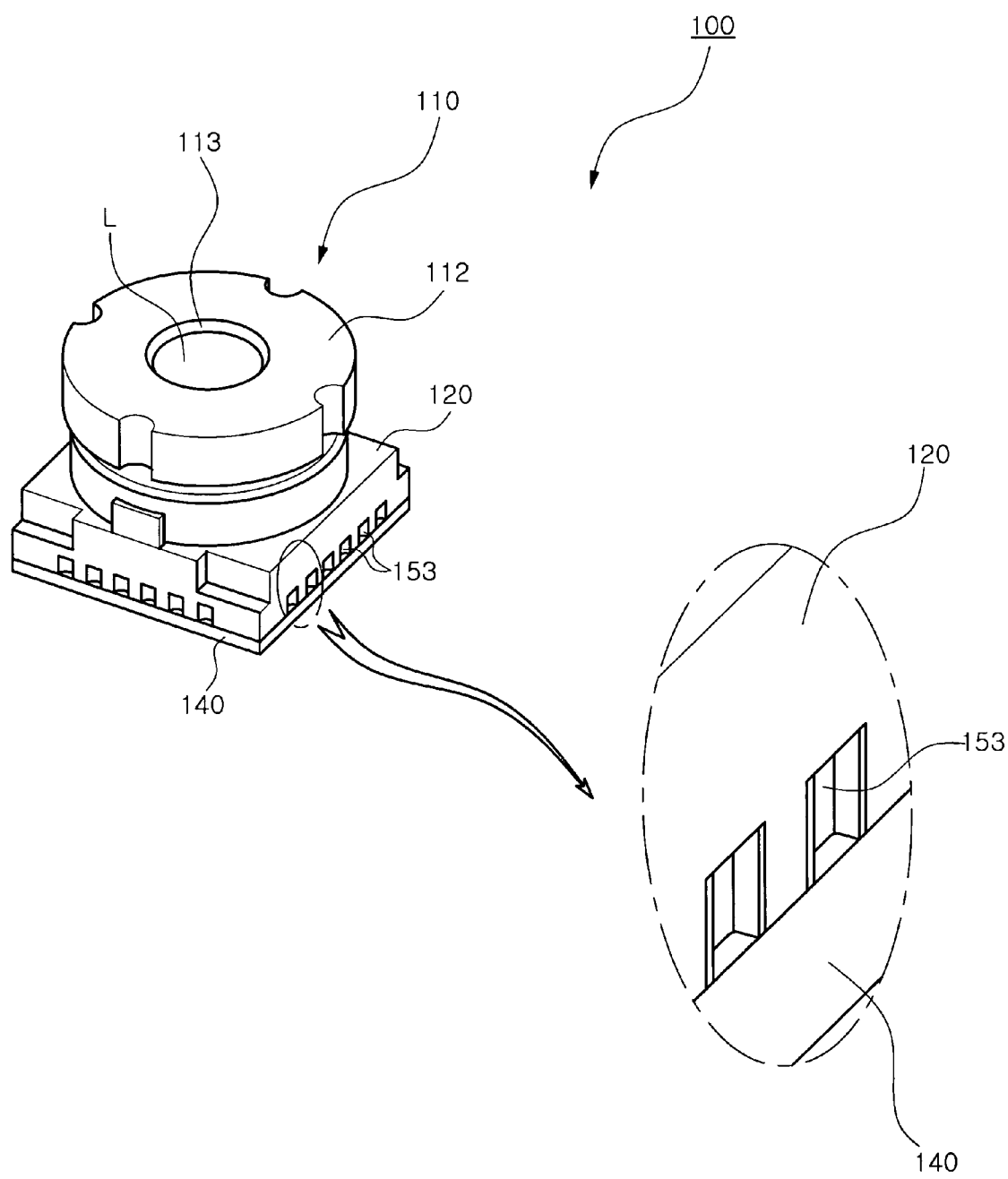
FIG. 4 is a perspective view illustrating a camera module package according to an exemplary embodiment of the invention.

FIG.4 is a perspective view illustrating a camera module package according to an exemplary embodiment of the invention.

Figure 5:
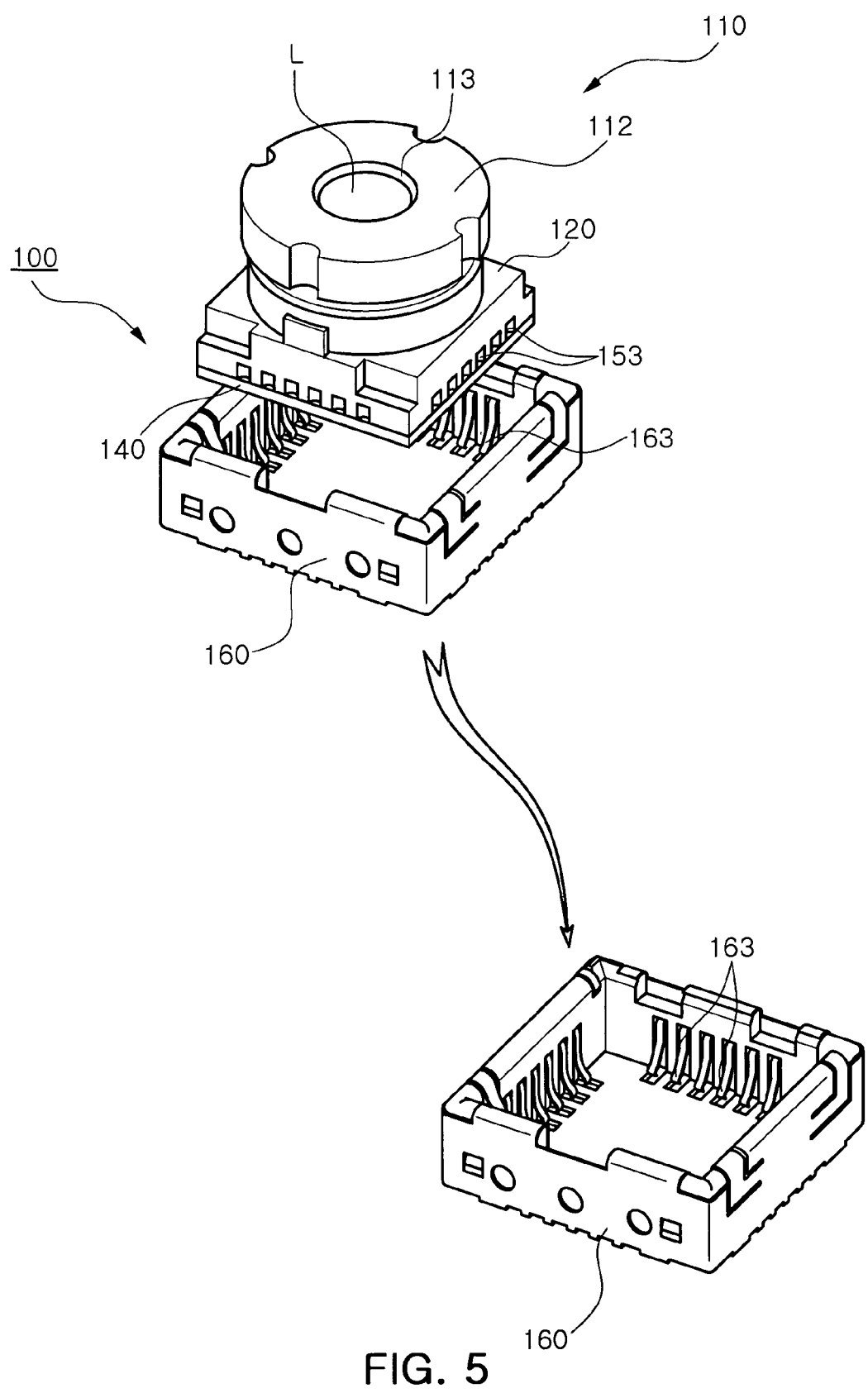
FIG. 5 is a view illustrating a camera module package installed in a socket according to an exemplary embodiment of the invention.

FIG.5 is a view illustrating a camera module package installed in a socket according to an exemplary embodiment of the invention.

As shown in FIGS. 2 to 5, the camera module package 100 of the present embodiment includes an optical system 110, a housing 120, an image sensor 130, a board 140 and a contact part 150.

The housing 120 holds the optical system 110 therein and the optical system 110 includes at least one lens L and a lens barrel 112 having the lens L disposed in an inner space thereof.

The lens barrel 112 has the inner space of a predetermined size where the lens L can be deposited. The lens barrel 112 has a lens hole 113 of a predetermined size perforated in a top surface thereof.

The plurality lenses L may be disposed in the lens barrel 112. In this case, a spacer (not shown) may be additionally provided between one of the lenses L and the adjacent lens L. In addition to this spacer, an aperture stop (not shown) may be disposed in the lens barrel 112 to adjust an amount of light passing through the lens hole 113.

The lens barrel 112 may fix the lenses at a bottom. That is, the lenses L are sequentially inserted and deposited through an open bottom of the lens barrel 112 and then a pressure-fit ring (not shown) is forcibly pressure-fit into the open bottom of the lens barrel 112 to fix the lenses. But the present invention is not limited thereto. The lens barrel 112 may fix the lenses at a top. That is, the lenses are sequentially inserted and deposited through an open top of the lens barrel 112 and then a retainer having the lens hole perforated therein is screw-fastened to the open top of the lens barrel to fix the lens.

The lens barrel 112 has a male screw 112a formed on an outer surface thereof and the male screw 112a is threaded with a female screw 122 formed on an inner surface of the center hole of the housing 120. The male screw 112a and the female screw 122 threaded with each other allow the lens barrel 112 to be reciprocally movable in an optical axis direction with respect to the housing 120.

The image sensor 130 is an imaging device having an imaging area formed on a top surface thereof to image light and output the imaged light as an electrical signal. A plurality of sensor bonding pads 131 are formed along an outer edge of the top surface of the image sensor 130 to transmit and receive the signal.

Also, a filtering part 125 such as an infra-red (IR) cut filter may be provided between the lens L disposed in the lens barrel 112 and the image sensor 130 to filter infra-red rays from the light.

The board 140 has a pattern circuit of various shapes on the top surface thereof and is assembled to a bottom of the housing 120 by a bonding material. The board 140 has a plurality of board bonding pads 141 formed at an outer edge thereof.

Here, the board 140 is a rigid board, but not limited thereto. The board 1240 may be a flexible board.

The board 140 is provided with a positioning hole 148 (see FIG. 3) into which a positioning pin 128 (see FIG. 3) protruded from the bottom of the housing 120 is inserted. Also, a passive device 149 such as a capacitor and a resistor may be disposed on the other area of the board 140 excluding the mounting area of the image sensor 130.

Meanwhile, the contact part 150 is configured as a conductive signal line integrally formed with the housing 120. This contact part 150 serves to electrically connect the plurality of sensor bonding pads 131 formed on the top surface of the image sensor 130 to the plurality of board bonding pads 141 formed on the top surface of the board 140 together when engaging the housing with the board 140.

This conductive signal line includes a horizontal conductive line 151 and a vertical conductive line 152. The horizontal conductive line 151 is formed by plating on a horizontal groove 127a formed in an inner surface of the housing 120 to be co-planar with the top surface of the image sensor 130 and bonded to the sensor bonding pads 131 formed on the top surface of the image sensor 130 by a bump. The vertical conductive line 152 is formed by plating on a vertical groove 127b extended directly below from one end of the horizontal groove 127a and bonded to the board bonding pads 141 formed on the top surface of the board 140 by a bump.

Also, the contact part 150 further includes a plurality of external contact terminals 153. The external contact terminals 153 are extended from the vertical conductive line 152 to be exposed to an outer surface of the housing 120. The plurality of external contact terminals 153 formed on an outer surface of a lower end of the housing 120 are in flexible contact and electrically connected with contact pins 163 of a socket mounted on a main board (not shown) and having the board 140 together with the housing 120 inserted thereinto.

These external contact terminals 153 are recessed with a predetermined depth in an outer surface of a lower end of the housing 120 and disposed in the terminal groove 127c.

Here, the horizontal conductive line 151, the vertical conductive line 152 and the external contact terminals 153 are plated with conductive materials in the horizontal groove 127a, the vertical groove 127b and the terminal groove 127c provided in the housing 120, respectively. However, the present invention is not limited thereto. The horizontal, vertical and terminal grooves 127a, 127b, and 127c may be filled with conductive fillers by printing. Alternatively, the horizontal, vertical, and terminal grooves 127a, 127b, and 127c provided when forming the housing 120 may be secondarily formed using conductive resin materials by double injection molding.

Also, a conductive adhesive 132 such as anisotropic conductive film (ACF) and nonconductive paste (NCP) may be provided between the sensor bonding pads 131 and the horizontal conductive line 151 to enhance bonding force between the housing 120 and the image sensor 130. Moreover, a conductive adhesive 142 may be formed between the board bonding pads 141 and the vertical conductive line 152 to enhance bonding force between the housing 120 and the board 140.

To assemble the camera module package 100 as described above, first, the optical system 110 having the lenses L deposited in the inner space of the lens barrel 112 need to be assembled to the housing 120. To this end, the male screw 112a formed on the outer surface of the lens barrel 112 is threaded with the female screw 122 formed in the center hole of the housing 120. The male screw 112a and the female screw 22 threaded with each other allow the lens barrel 112 to be assembled to the housing 120 to be movable along an optical axis direction.

In addition, the image sensor 130 is die-attached on the top of the board 140 and a plurality of passive devices 149 are mounted adjacent to the image sensor.

Subsequently, the positioning pins 128 protruded from the bottom of the housing 120 are located corresponding to the positioning holes 148 of the board 140. At this time, the housing 120 and the board 140 are bonded to each other by a bonding material. Accordingly, the plurality of sensor bonding pads 131 formed on the top surface of the image sensor 130 are brought in contact with the horizontal conductive lines 151 of the contact part 150 formed on the inner surface of the housing 120. Also, the board bonding pads 141 formed on the top surface of the board 140 are brought in contact with the vertical conductive lines 152 of the contact part 150 formed on the inner surface of the housing 120. Therefore, these horizontal and vertical conductive lines 151 and 152 of the contact part 150 allow the image sensor 130 to be electrically connected to the board 140.

This accordingly precludes a need for an additional process of wire-bonding the image sensor 130 mounted on the board 140 by a plurality of wires as in the conventional camera module package. Besides, the process of bonding the housing 120 and the board 140 to each other can be performed at the same time as the process of electrically connecting the board 140 and the image sensor 130 to each other. This simplifies an assembly process and enhances productivity.

Subsequently, the camera module package 100 where the housing 120 is completely assembled to the board 140 can be mounted on a mounting area of a main board (not shown) by a ball grid array (BGA) method, thereby improving productivity.

As shown in FIGS. 4 and 5, the camera module package 100 may be assembled to a socket 160 disposed on the main board. Here, when the board 140 together with the housing 120 is inserted into the socket 160, the external contact terminals 153 extended from the vertical conductive line 152 of the contact part 150 are exposed outward in the terminal groove 127c formed in the outer surface of the lower end of the housing 120. This allows the plurality of contact pins 163 disposed on the socket 160 to be correspondingly inserted into the external contact terminals 153 and to be in flexible contact and electrically connected with the housing 120.

At this time, the external contact terminals 153 in contact with the contact pins 163 of the socket 160 are provided on the outer surface of the lower end of the housing 120 and thus located above a bonding portion between the housing 120 and the board 140. In the conventional camera module package, the external contact terminals are formed on an outer edge of the board and thus contaminated by an overflowing bonding material when the board and the housing are bonded by a bonding material and thus are in poor contact with the contact pins.

As set forth above, according to exemplary embodiments of the invention, a contact part electrically connecting an image sensor and a board to each other is integrally formed on an inner surface of a housing. Thus, a process of bonding the housing and the board together can be performed at the same time as a process of electrically connecting the image sensor and the board to each other. This precludes a need for a conventional process of wire-bonding an image sensor mounted on a board by wires. Therefore, this simplifies a package manufacturing process to save manufacturing costs, enhances productivity and reduces a height of the package to ensure a smaller product.

In addition, external contact terminals in electrical contact with contact pins of a socket are formed on an outer surface of a lower end of the housing. Accordingly, unlike a conventional camera module package, the camera module package is fundamentally free from contamination and poor contact of the external contact terminals caused by an overflowing bonding material when the housing and the board are bonded together. This accordingly assures higher reliability of the product.

While the present invention has been shown and described in connection with the exemplary embodiments, it will be apparent to those skilled in the art that modifications and variations can be made without departing from the spirit and scope of the invention as defined by the appended claims.

What is claimed is:

1. A camera module package comprising:
 a housing having an optical system;
 a board bonded to a bottom end of the housing and mounting an image sensor on a top surface thereof;
 a contact part integrally formed in the housing to electrically connect a sensor bonding pad of the image sensor with a board bonding pad of the board each other when the housing is engaged with the board,
 wherein the contact part comprises
  a horizontal conductive line formed on a horizontal groove formed in an inner surface of the housing,
  a vertical conductive line formed on a vertical groove extended directly below from one end of the horizontal groove, and
  a external contact terminal extended from the vertical conductive line and formed in a terminal groove recessed with a predetermined depth in an outer surface of a lower end of the housing to expose the vertical conductive line outward.

2. The camera module package of claim 1, wherein the contact part comprises:
 a horizontal conductive line formed by plating and bonded by a bump to the sensor bonding pad formed on an top surface of the image sensor; and a vertical conductive line formed by plating and bonded by a bump to the board bonding pad formed on the top surface of the board.

3. The camera module package of claim 2, wherein the contact part comprises a plurality of external contact terminals extended from the vertical conductive line to be exposed to an outer surface of the housing.

4. The camera module package of claim 3, wherein the external contact terminals are in flexible contact with contact pins of a socket mounted on a main board.

5. The camera module package of claim 2, further comprising a conductive adhesive between the horizontal conductive line and the sensor bonding pad.

6. The camera module package of claim 2, further comprising a conductive adhesive between the vertical conductive line and the board bonding pad.

7. The camera module package of claim 1, wherein the optical system comprises:
a lens barrel assembled in a center hole formed in the housing to be movable in an optical axis direction and having a lens hole formed in a top surface thereof; and
at least one lens disposed in the lens barrel.

8. The camera module package of claim 1, wherein a filtering part is disposed between the lens and the image sensor.

* * * * *